(12) United States Patent
Park et al.

(10) Patent No.: US 11,004,760 B2
(45) Date of Patent: *May 11, 2021

(54) CHIP STRUCTURE OPERATING METHOD INCLUDING HEATING ELEMENTS TO REDUCE TEMPERATURE VARIATION

(71) Applicant: Samsung Electronics Co., Ltd., Suwon-si (KR)

(72) Inventors: Woo Hyun Park, Seongnam-si (KR); Jae Choon Kim, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/752,044

(22) Filed: Jan. 24, 2020

(65) Prior Publication Data

US 2020/0161201 A1 May 21, 2020

Related U.S. Application Data

(63) Continuation of application No. 15/922,478, filed on Mar. 15, 2018, now Pat. No. 10,553,513.

(30) Foreign Application Priority Data

Aug. 16, 2017 (KR) .................. 10-2017-0103828

(51) Int. Cl.
*H01L 27/146* (2006.01)
*H01L 23/34* (2006.01)
(Continued)

(52) U.S. Cl.
CPC .... *H01L 23/3114* (2013.01); *H01L 21/76877* (2013.01); *H01L 23/5283* (2013.01);
(Continued)

(58) Field of Classification Search
CPC ......... H01L 27/14603; H01L 27/14634; H01L 27/14643; H01L 23/345
See application file for complete search history.

(56) References Cited

U.S. PATENT DOCUMENTS

| 5,334,829 A | 8/1994 | Ueno et al. |
| 7,480,006 B1 | 1/2009 | Frank |

(Continued)

FOREIGN PATENT DOCUMENTS

| JP | 2013-070249 | 4/2013 |
| JP | 2015126043 | 7/2015 |
| KR | 1020030057609 | 11/2007 |
| KR | 101439191 B1 | 9/2014 |

OTHER PUBLICATIONS

Search Report and Written Opinion dated Aug. 6, 2018 for corresponding Singapore Patent Application No. 10201804909V (13 pages).

*Primary Examiner* — Allen L Parker
*Assistant Examiner* — Gustavo G Ramallo
(74) *Attorney, Agent, or Firm* — Myers Bigel, P.A

(57) ABSTRACT

A chip structure is provided. The chip structure includes: a first lower chip structure; and an upper chip structure on the first lower chip structure and having a pixel array region. The first lower chip structure includes: a first lower semiconductor substrate having a first side and a second side opposing each other; a first portion on the first side of the first lower semiconductor substrate; and a second portion on the second side of the first lower semiconductor substrate, the first portion of the first lower chip structure includes a gate wiring, the second portion of the first lower chip structure includes a second side wiring and a heating element, and the heating element is on the same plane as that of the second side wiring and has a length greater than that of the second side wiring.

20 Claims, 23 Drawing Sheets

(51) Int. Cl.
  *H01L 23/31*    (2006.01)
  *H04N 5/225*    (2006.01)
  *H01L 23/532*   (2006.01)
  *H01L 23/528*   (2006.01)
  *H01L 21/768*   (2006.01)
  *H01L 25/065*   (2006.01)

(52) U.S. Cl.
  CPC ...... *H01L 23/5329* (2013.01); *H01L 25/0657* (2013.01); *H01L 27/14603* (2013.01); *H01L 27/14634* (2013.01); *H01L 27/14636* (2013.01); *H04N 5/2253* (2013.01); *H01L 23/345* (2013.01); *H01L 27/1469* (2013.01); *H01L 27/14643* (2013.01)

(56) References Cited

U.S. PATENT DOCUMENTS

| | | |
|---|---|---|
| 7,759,751 B2 | 7/2010 | Ono |
| 8,836,140 B2 | 9/2014 | Ma et al. |
| 9,305,958 B2 | 4/2016 | Hagiwara et al. |
| 2008/0073742 A1 | 3/2008 | Adkisson et al. |
| 2008/0173792 A1 | 7/2008 | Yang et al. |
| 2008/0308928 A1 | 12/2008 | Chang et al. |
| 2012/0051392 A1 | 3/2012 | Grillberger et al. |
| 2012/0194719 A1 | 8/2012 | Churchwell et al. |
| 2012/0275128 A1 | 11/2012 | Takada et al. |
| 2013/0033303 A1 | 2/2013 | Morimoto et al. |
| 2015/0189214 A1 | 7/2015 | Kurose |
| 2017/0053960 A1 | 2/2017 | Wakiyama et al. |
| 2017/0150081 A1* | 5/2017 | Stockmeier .......... H04N 5/3651 |
| 2017/0154913 A1 | 6/2017 | Jun |

\* cited by examiner

CHIP STRUCTURE OPERATING METHOD INCLUDING HEATING ELEMENTS TO REDUCE TEMPERATURE VARIATION

CROSS-REFERENCE TO RELATED APPLICATION

This application is a continuation of U.S. patent application Ser. No. 15/922,478, filed Mar. 15, 2018, which itself claims benefit of priority to Korean Patent Application No. 10-2017-0103828 filed on Aug. 16, 2017 in the Korean Intellectual Property Office, the disclosure of which is incorporated herein by reference in its entirety.

BACKGROUND

1. Technical Field

The present inventive concept relates to a chip structure, and more particularly, to a chip structure including a heating element capable of heating a pixel array region of an image sensor.

2. Description of Related Art

An image sensor that converts incident light into an electrical signal to form image data may be used not only in an electronic device for a general consumer, such as a digital camera, a camera for a mobile phone, a portable camcorder, or the like, but also in a camera mounted on a vehicle, a security device, a robot, or the like. Because image sensors may be miniaturized and have high resolution, various studies aimed at satisfying the demand for miniaturization and high resolution of such image sensors are being conducted.

SUMMARY

An aspect of the present inventive concept may provide a chip structure including a plurality of chips.

An aspect of the present inventive concept may provide a chip structure including a heating element.

According to an aspect of the present inventive concept, a chip structure is provided. The chip structure includes: a first lower chip structure; and an upper chip structure on the first lower chip structure and having a pixel array region. The first lower chip structure comprises: a first lower semiconductor substrate having a first side and a second side opposing each other; a first portion on the first side of the first lower semiconductor substrate; and a second portion on the second side of the first lower semiconductor substrate, the first portion of the first lower chip structure comprises a gate wiring, the second portion of the first lower chip structure comprises a second side wiring and a heating element, and the heating element is on the same plane as that of the second side wiring and has a length greater than that of the second side wiring.

According to an aspect of the present inventive concept, a chip structure is provided. The chip structure includes: a lower semiconductor substrate having a first side and a second side opposing each other; a first portion on the first side of the lower semiconductor substrate, and having a gate wiring; and a second portion on the second side of the lower semiconductor substrate, and having a second side wiring and a heating element. The heating element is on the same plane as that of the second side wiring, and has a length greater than that of the second side wiring.

According to an aspect of the present inventive concept, a chip structure is provided. The chip structure comprises: a lower chip structure having a wiring and a heating element, the heating element being on the same plane as that of the wiring and having a length greater than that of the wiring; and an upper chip structure disposed on the lower chip structure and having a pixel array region. The heating element overlaps a portion of the pixel array region. An arrangement density of the wiring and an arrangement density of the heating element are configured to reduce temperature differences between different areas of the pixel array region.

According to an aspect of the present inventive concept, a chip structure operating method is provided. The chip structure operating method comprises operating a chip structure comprising temperature sensors, heating elements, and a pixel array region, determining a high temperature region and a low temperature region in the pixel array region by sensing temperatures in the pixel array region using the temperature sensors, and heating the low temperature region in the pixel array region using the heating elements.

BRIEF DESCRIPTION OF DRAWINGS

The above and other aspects, features and other advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

An image sensor, which includes photoelectric elements (e.g., photodiodes), may be mounted on or in an electronic device. For example, the image sensor may be mounted on an electronic device as a 2-stack CMOS image sensor package formed with a logic chip, or may be mounted on an electronic device as a 3-stack CMOS image sensor package formed with a logic chip and a DRAM chip. The image sensor may, however, be affected by heat from an adjacent chip, such as a logic chip. Because the heat generated by an adjacent chip may not be uniformly transferred across the entirety of the pixel array, some areas or regions of the pixel array may have a relatively high temperature and some areas or regions of the pixel array may have a relatively low temperature. The charge generated by the photoelectric elements in response to incident light is dependent on temperature. As a result, the disparity in temperature across the pixel array may result in image distortion. Some embodiments of the inventive concept stem from a realization that a chip structure adjacent a pixel array may include both wiring and a heating element and that the arrangement densities of the wiring and heating element, respectively, can be configured to reduce temperature differences across regions or areas of the pixel array. By reducing temperature variation across the pixel array, image distortion and errors may be reduced.

Figure 1:
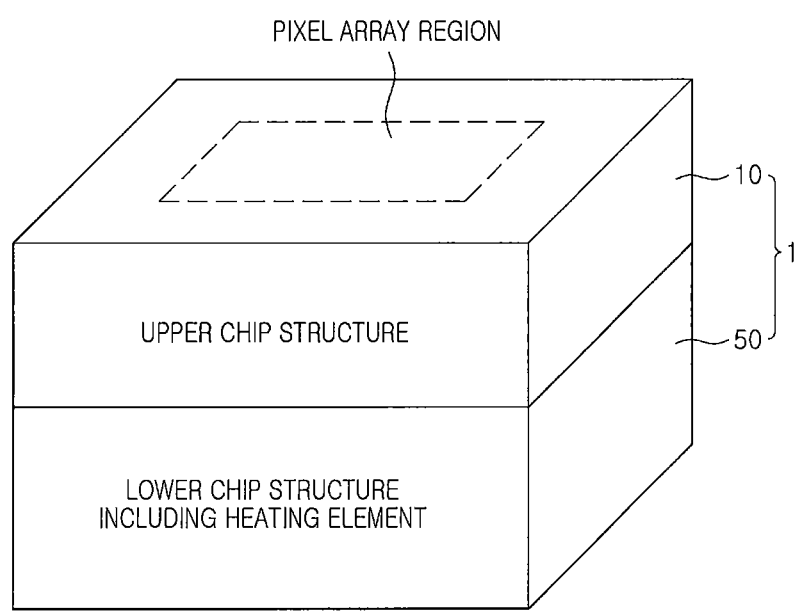
FIG. 1 is a perspective view schematically illustrating a chip structure according to some embodiments of the inventive concept.

A chip structure according to an example embodiment will be described with reference to FIG. 1. FIG. 1 is a perspective view schematically illustrating a chip structure according to some embodiments.

Referring to FIG. 1, a chip structure 1 may include a lower chip structure 50 having a heating element and an upper chip structure 10 disposed on the lower chip structure 50. The upper chip structure 10 may be an image sensor including a pixel array region.

Figure 2:
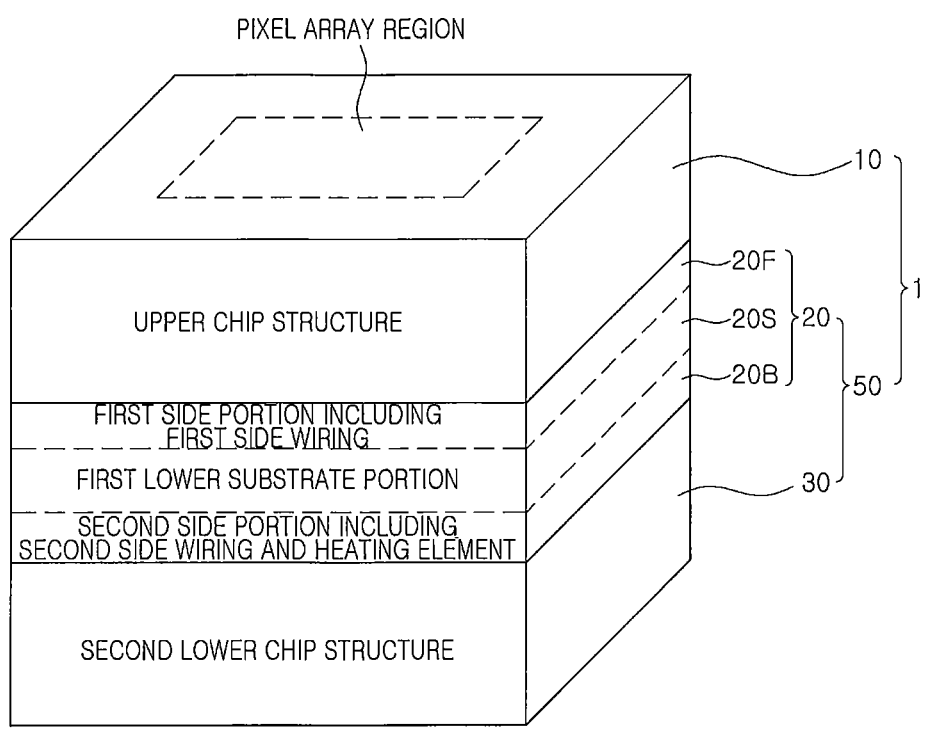
FIG. 2 is a perspective view schematically illustrating an example of a chip structure according to some embodiments of the inventive concept.

An example of the lower chip structure 50 will be described with reference to FIG. 2. FIG. 2 is a perspective view schematically illustrating an example of a chip structure according to some embodiments.

Referring to FIGS. 1 and 2, the lower chip structure 50 may include a second lower chip structure 30 and a first lower chip structure 20 disposed on the second lower chip structure 30. The first lower chip structure 20 may be interposed between the upper chip structure 10 and the second lower chip structure 30.

The first lower chip structure 20 may include a first portion 20F, a second portion 20B, and a first lower substrate portion 20S between the first portion 20F and the second portion 20B. The first portion 20F may be closer than the second portion 20B to the upper chip structure 10. The first portion 20F may include a first side wiring. The second portion 20B may include a second side wiring and a heating element.

Figure 3:
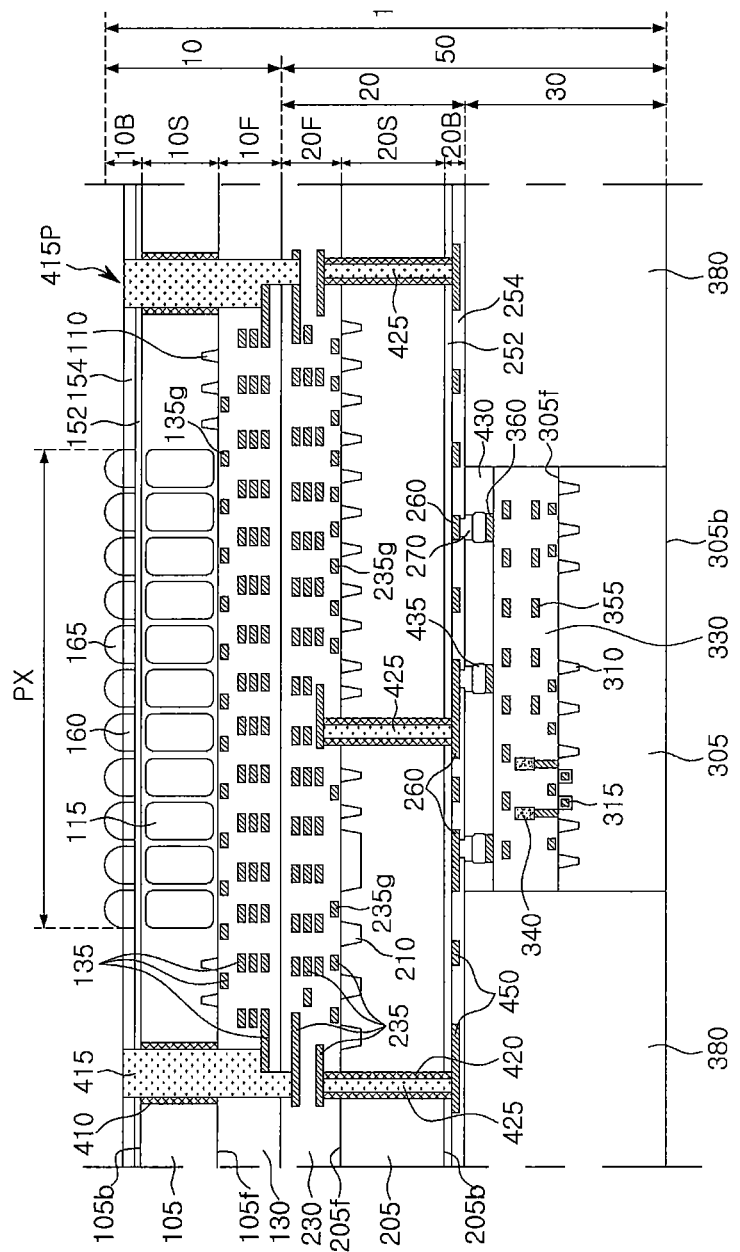
FIG. 3 is a longitudinal cross-sectional view schematically illustrating an example of a chip structure according to some embodiments of the inventive concept.

An example of the chip structure 1 including the upper chip structure 10 and the lower chip structure 50 will be described with reference to FIG. 3. FIG. 3 is a longitudinal cross-sectional view schematically illustrating an example of a chip structure according to some embodiments.

Referring to FIG. 3 in addition to FIGS. 1 and 2, the upper chip structure 10 may include a first portion 10F, a second portion 10B, and an upper substrate portion 10S between the first portion 10F and the second portion 10B.

The upper substrate portion 10S may include an upper semiconductor substrate 105 having a first side 105f and a second side 105b opposing each other, and photoelectric elements 115 in the upper semiconductor substrate 105.

In this specification, with respect to a first side and a second side of a semiconductor substrate, opposing each other, the 'first side' may be referred to as a 'front side', and the 'second side' may be referred to as a 'back side'.

The photoelectric elements 115 may be a silicon photodiode or a silicon photoelectric conversion element. The photoelectric elements 115 may be arranged in a row direction and a column direction. In this specification, a region in which the photoelectric elements 115 are arranged is defined as a 'pixel array region PX'. Thus, the pixel array region PX may be understood as a region including the photoelectric elements 115.

The first portion 10F may be disposed on the first side 105f of the upper semiconductor substrate 105. The first portion 10F may include a first side insulating layer 130 of the first side 105f of the upper semiconductor substrate 105 and a first side wiring 135 in the first side insulating layer 130. The first side wiring 135 may be may have a multilayer structure. A wiring among the first side wiring 135, close to the first side 105f of the upper semiconductor substrate 105, may be upper gate wirings 135g. Shallow trench isolation regions 110 may be disposed in the first side 105f of the upper semiconductor substrate 105.

The second portion 10B may be disposed on the second side 105b of the upper semiconductor substrate 105. The second portion 10B may include a second side lower insulating layer 152 on the second side 105b of the upper semiconductor substrate 105, a second side upper insulating layer 154 on the second side lower insulating layer 152, color filters 160 in the second side upper insulating layer 154, and microlenses 165 on the color filters 160. The photoelectric elements 115, the color filters 160, and the microlenses 165 may overlap each other.

The first lower chip structure 20 may include a first portion 20F, a second portion 20B, and a first lower substrate portion 20S between the first portion 20F and the second portion 20B.

The first lower substrate portion 20S may include a first lower semiconductor substrate 205 having a first side 205f and a second side 205b opposing each other.

The first portion 20F may be disposed on the first side 205f of the first lower semiconductor substrate 205. The first portion 20F may include a first side insulating layer 230 disposed on the first side 205f of the first lower semiconductor substrate 205 and a first side wiring 235 in the first side insulating layer 230. The first side wiring 235 may have a multilayer structure. A wiring among the first side wiring 235, close to the first side 205f of the first lower semiconductor substrate 205, may be lower gate wirings 235g. Shallow trench isolation regions 210 may be disposed in the first side 205f of the first lower semiconductor substrate 205.

The second portion 20B may be disposed on the second side 205b of the first lower semiconductor substrate 205. The second portion 20B may include a second side lower insulating layer 252 disposed on the second side 205b of the first lower semiconductor substrate 205, a second side wiring 260 and a heating element 450 on the second side lower insulating layer 252, and a second side upper insulating layer 254 covering or enveloping the second side wiring 260 and the heating element 450.

In some embodiments, the second side wiring 260 and the heating element 450 may be disposed on the same plane. The second side wiring 260 and the heating element 450 may be formed of the same conductive material (e.g., titanium (Ti), titanium nitride (TiN), and/or copper (Cu), or the like).

The first lower chip structure 20 may include back side pads 270 electrically connected to the second side wiring 260 while passing through the second side upper insulating layer 254 and spaced apart from the heating element 450.

The second lower chip structure 30 may include a second lower semiconductor substrate 305 having a first side 305f and a second side 305b opposing each other, a first side insulating layer 330 disposed on the first side 305f of the second lower semiconductor substrate 305, a first side wiring 335 in the first side insulating layer 330, and front side pads 360 on the first side insulating layer 330.

Shallow trench isolation regions 310 may be disposed in the first side 305f of the second lower semiconductor substrate 305. Embedded gates 315 may be disposed in the second lower semiconductor substrate 305 adjacent to the first side 305f of the second lower semiconductor substrate 305.

In some embodiments, the second lower chip structure 30 may include data storage elements 340 in the first side insulating layer 230. For example, the data storage elements 340 may be memory cell capacitors of a dynamic random access memory (DRAM), but embodiments of the inventive concept are not limited thereto. The data storage elements 340 may be formed of a material that may store data using a resistance change, such as, for example, a phase change material.

In some embodiments, the chip structure 1 may include molding layers 380 located on both sides of the second lower chip structure 30 and opposing the first lower chip structure 20.

In some embodiments, the chip structure 1 may include conductive connectors 435 disposed between the back side pads 270 of the first lower chip structure 20 and the front side pads 360 of the second lower chip structure 30 to electrically connect the back side pads 270 to the front side pads 360. Thus, the first lower chip structure 20 and the second lower chip structure 30 may be electrically connected to each other. Side surfaces of the conductive connectors 435 may be surrounded by an insulating material 430.

In some embodiments, the first lower chip structure 20 may include lower through electrodes 425 passing through the first lower semiconductor substrate 205. The lower through electrodes 425 may allow the first side wiring 235 in the first portion 20F and the second side wiring 260 in the second portion 20B to be electrically connected to each other. The first lower chip structure 20 may include a lower insulative spacer 420 interposed between the lower through electrodes 425 and the first lower semiconductor substrate 205 to allow the lower through electrodes 425 to be insulated from the first lower semiconductor substrate 205. A portion of the lower through electrodes 425 may be electrically connected to the heating element 450.

In some embodiments, the upper chip structure 10 may include upper through electrodes 415 electrically connected to the first side wiring 135 in the first portion 10F while passing through the second portion 10B and the upper semiconductor substrate 105. The upper through electrodes 415 may pass through the second portion 10B, not overlapping the pixel array region PX, to be exposed. Regions of the upper through electrodes 415, having been exposed, are defined as pad regions 415p of the chip structure 1.

Upper insulative spacers 410 allowing the upper through electrodes 415 and the upper semiconductor substrate 105 to be electrically isolated from each other may be disposed between the upper through electrodes 415 and the upper semiconductor substrate 105.

In some embodiments, the upper through electrodes 415 extend into the first portion 20F of the first lower chip structure 20 to be electrically connected to the first side wiring 235 in the first portion 20F of the first lower chip structure 20. Thus, the upper chip structure 10, the first lower chip structure 20, and the second lower chip structure 30 may be electrically connected to each other.

In some embodiments, in a region of the first portion 20F of the first lower chip structure 20, a greater amount of heat may be generated in a region of the first portion 20F in which an arrangement density of the lower gate wirings 235g is high than that generated in a region of the first portion 20F in which the arrangement density of the lower gate wirings 235g is low. In example embodiments, the arrangement density of the lower gate wirings 235g may correspond to an arrangement density of transistors. Thus, a region in which the arrangement density of the lower gate wirings 235g is high may represent a region in which the arrangement density of transistors is high.

In the second portion 20B of the first lower chip structure 20, a greater amount of heat may be generated in a region of the second portion 20B in which an arrangement density of the heating element 450 is high than a region of the second portion 20B in which the arrangement density of the heating element 450 is low.

In the absence of the heating element 450, differences in an amount of heat generated depend on the arrangement density of the lower gate wirings (235g of FIG. 3). Thus, due to the difference in an amount of heat generated depending on the arrangement density of the lower gate wirings (235g of FIG. 3), a high temperature region and a low temperature region may be generated in the pixel array region PX. In a case in which a temperature difference between the high temperature region and the low temperature region in the pixel array region PX is large, a defect may occur in an electronic product including the chip structure 1 having the pixel array region PX. For example, in a case in which light incident into the pixel array region PX is imaged to be presented in a display, image errors may occur.

To prevent or reduce such image errors, an arrangement density of the heating element 450 disposed in a region opposing the low temperature region in which a temperature is relatively low in the pixel array region PX may exceed an arrangement density of the heating element 450 disposed in a region opposing the high temperature region in which a temperature is relatively high in the pixel array region PX. In some embodiments, to prevent image errors, the heating element 450 is not disposed in a region opposing the high temperature region in which a temperature is relatively high in the pixel array region PX, but is disposed in a region opposing the low temperature region in which a temperature is relatively low in the pixel array region PX. Thus, a temperature of the low temperature region of the pixel array region PX may increase so temperature variations in the pixel array region PX may be significantly reduced.

Thus, according to example embodiments, configuring an arrangement density of the heating element 450 may allow temperature variations in the pixel array region PX to be significantly reduced, so image errors may be prevented or reduced.

Figure 4:
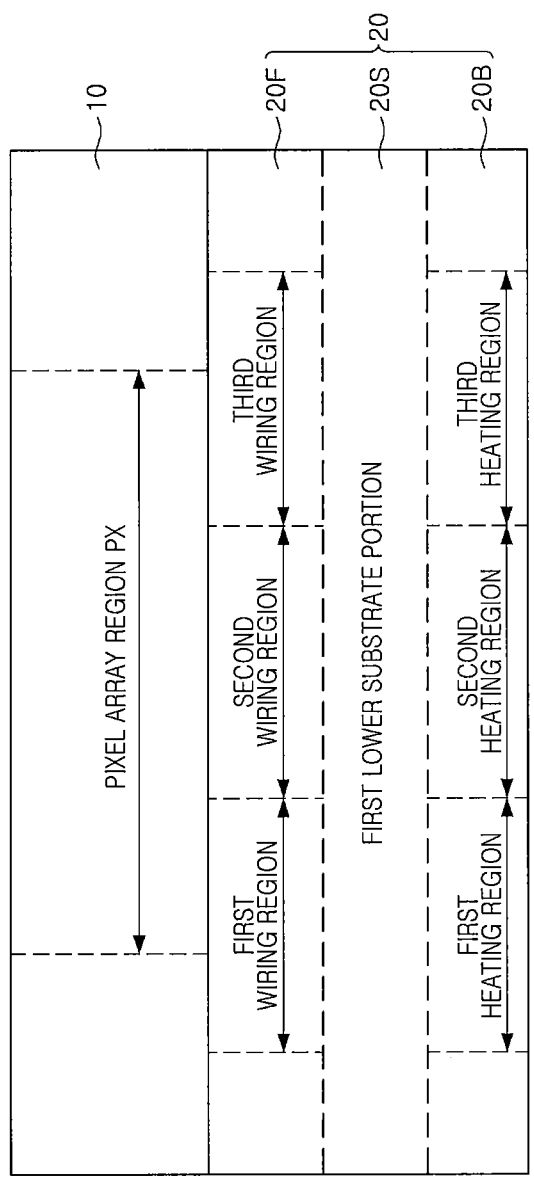
FIG. 4 is a block diagram schematically illustrating a cross-sectional area of a portion of a chip structure to illustrate an example of a chip structure according to some embodiments of the inventive concept.

An example with respect to the arrangement of the heating element 450 will be described with reference to FIG. 4. FIG. 4 is a block diagram schematically illustrating a region of a cross section of the first lower chip structure 20 and the upper chip structure 10 to illustrate an example of a chip structure according to some embodiments.

Referring to FIG. 4 in addition to FIG. 3, the first portion 20F of the first lower chip structure 20 may include a plurality of wiring regions having different wiring densities, and the second portion 20B of the first lower chip structure 20 may include a plurality of heating regions having different heating element densities. The wiring density of the plurality of wiring regions may be an arrangement density of the lower gate wirings 235g, and the heating element density of the plurality of heating regions may be an arrangement density of the heating element 450.

In some example embodiments, the plurality of wiring regions of the first portion 20F of the first lower chip structure 20 may include a first wiring region, a second wiring region, and a third wiring region, and the plurality of heating regions of the first lower chip structure 20 may include a first heating region opposing the first wiring region, a second heating region opposing the second wiring region, and a third heating region opposing the third wiring region.

In some embodiments, the arrangement density of the lower gate wirings 235g may be higher in the second wiring region than that in the first wiring region and the third wiring region, and the arrangement density of the heating element 450 may be lower in the second heating region opposing the second wiring region than that in the first heating region and the third heating region. The arrangement density of the lower gate wirings 235g may be lower in the first wiring region than in the third wiring region, and the arrangement density of the heating element 450 may be higher in the first heating region opposing the first wiring region than in the third heating region.

In some embodiments, the second wiring region may be a high density wiring region, the second heating region opposing the second wiring region may be a low density heating element region, the first wiring region may be a low density wiring region, the first heating region opposing the first wiring region may be a high density heating element region, the third wiring region may be a medium density wiring region, and the third heating region opposing the third wiring region may be a medium density heating element region.

Thus, the plurality of wiring regions having different wiring densities may allow temperature variation in the pixel array region PX to be reduced, while the plurality of heating regions having different heating element densities, disposed as described above, may allow temperature variation in the pixel array region PX to be reduced. Thus, as temperature variations in the pixel array region PX may be significantly reduced, image errors may be prevented.

Figure 5:
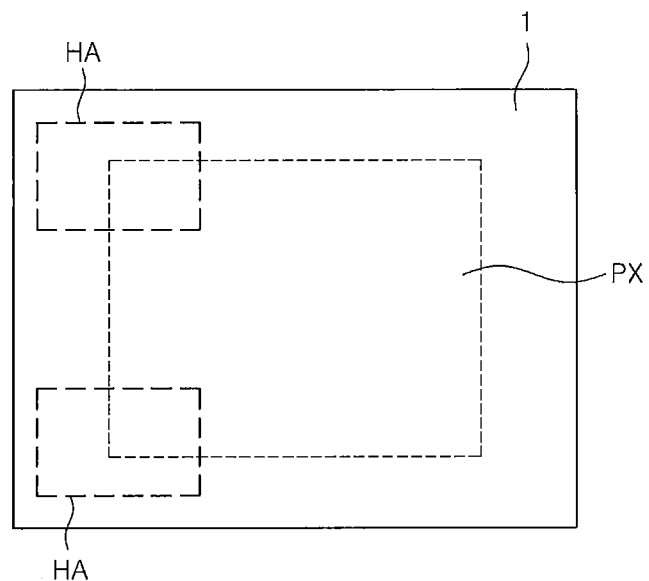
FIG. 5 is a plan view illustrating an exemplary example of a chip structure according to some embodiments of the inventive concept.

An example of a heating region in which the heating element 450 is disposed will be described with reference to FIGS. 5, 6, and 7. FIG. 5 is a plan view schematically illustrating a heating region, in which the chip structure 1, the pixel array region PX, and the heating element (450 of FIG. 3) are formed, FIG. 6 is a plan view illustrating an example of the heating region, and FIG. 7 is a cross-sectional view illustrating an example of the heating element and the second side wiring according to some embodiments of the inventive concept.

Figure 6:
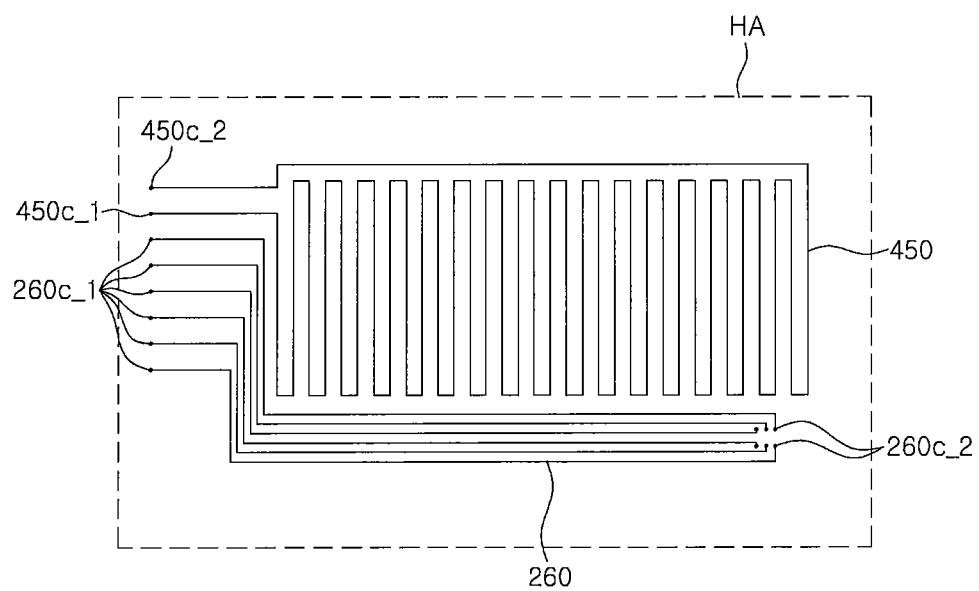
FIG. 6 is a plan view schematically illustrating an enlarged portion of a chip structure according to some embodiments of the inventive concept.
Figure 7:
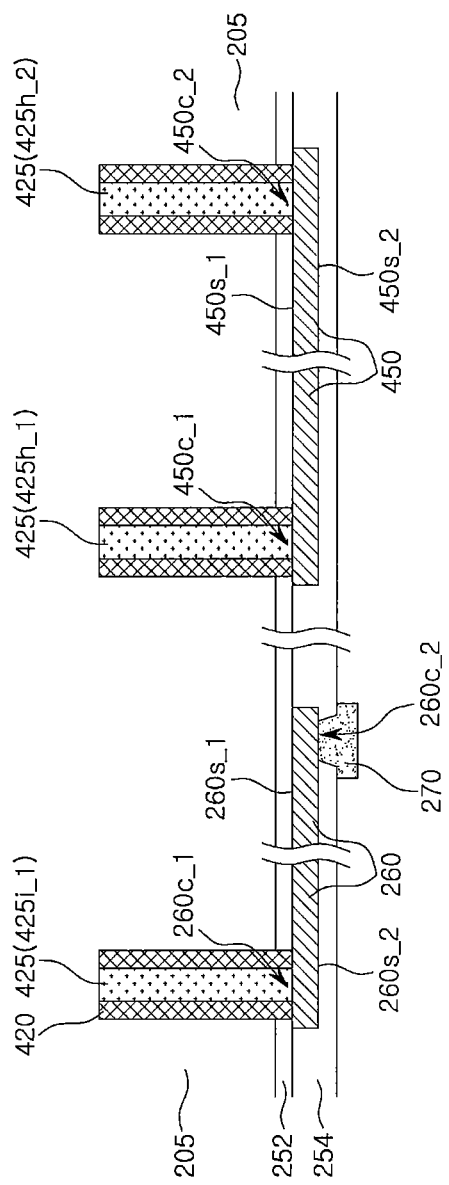
FIG. 7 is a cross-sectional view schematically illustrating an enlarged portion of a chip structure according to some embodiments of the inventive concept.

Referring to FIGS. 5, 6, and 7, a heating region HA in which the heating element (450 of FIG. 3) is formed may overlap at least a portion of the pixel array region PX. The heating element 450 may be disposed in the heating region HA. In some embodiments, the second side wiring 260 may be disposed in the heating region HA.

The second side wiring 260 may have a first surface 260s_1 and a second surface 260s_2 opposing each other. The first surface 260s_1 may have a first wiring contact region 260c_1, and the second surface 260s_2 may have a second wiring contact region 260c_2.

The heating element 450 may include a first heating element side 450s_1 having a first heating element contact region 450c_1 and a second heating element contact region 450c_2 and a second heating element side 450s_2 opposing the first heating element side 450s_1. The first heating element side 450s_1 may be coplanar with the first surface 260s_1.

In some embodiments, the second side wiring 260 may be a rewiring related to operation of the first lower chip structure 20, the second lower chip structure 30, and the upper chip structure 10. Thus, to improve an operation speed of the chip structure 1, a signal transmission speed in the second side wiring 260 may be increased, so a length of the second side wiring 260 may be designed to be as short as possible. Thus, heat generated in the second side wiring 260 may be significantly reduced.

In some embodiments, the heating element 450 may provide heat to the low temperature region of the pixel array region PX as described above, so the heating element may be designed to heat at least a portion of the pixel array region PX regardless of signal transmission speed. Thus, the heating element 450 may be designed to have a length capable of generating an amount of heat capable of heating at least a portion of the pixel array region PX by converting electrical energy, provided through the first heating element contact region 450c_1 and the second heating element contact region 450c_2, into thermal energy. Thus, the heating element 450 may have a greater length than a length of the second side wiring 260. For example, a length of the heating element 450 between the first heating element contact region 450c_1 and the second heating element contact region 450c_2 may be greater than a length of the second side wiring 260 between the first wiring contact region 260c_1 and the second wiring contact region 260c_2.

A first heating element electrode 425h_1 electrically connected to the first heating element contact region 450c_1 of the heating element 450, a second heating element electrode 425h_2 electrically connected to the second heating element contact region 450c_2 of the heating element 450, a first wiring electrode 425i_1 electrically connected to the first wiring contact region 260c_1 of the second side wiring 260, and a second wiring electrode 270 electrically connected to the second wiring contact region 260c_2 of the second side wiring 260 may be provided. The second wiring electrode 270 may be the back side pad 270 described with reference to FIG. 3.

The first heating element electrode 425h_1 and the second heating element electrode 425h_2, as well as the first wiring electrode 425i_1 may be the lower through electrodes 425 described with reference to FIG. 3. Thus, the first heating element electrode 425h_1 and the second heating element electrode 425h_2, as well as the first wiring electrode 425i_1 may be disposed on the same plane.

Thus, the back side pad 270 may be disposed on a plane different to that of the first heating element electrode 425h_1 and the second heating element electrode 425h_2, as well as the first wiring electrode 425i_1.

Insulative spacers 420, a first lower semiconductor substrate 205, a second side lower insulating layer 252, and a second side upper insulating layer 254, illustrated in FIG. 7, are the same as described with reference to FIG. 3, so a detailed description thereof will be omitted in the interest of brevity.

Figure 8:
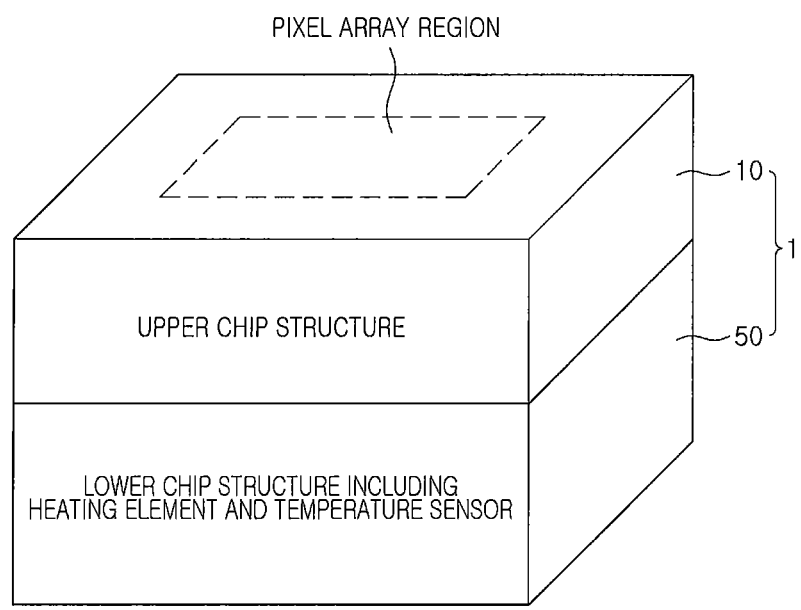
FIG. 8 is a perspective view schematically illustrating an example of a chip structure according to some embodiments of the inventive concept.

In some embodiments, as described above with reference to FIG. 1, the lower chip structure 50 of the chip structure 1 may include the heating element 450, but example embodiments are not limited thereto. For example, as illustrated in FIG. 8 schematically illustrating an example of a chip structure according to some embodiments, the lower chip structure 50 of the chip structure 1 may further include a temperature sensor. Thus, as illustrated in FIG. 8, the chip structure 1 including the lower chip structure 50 may further include the temperature sensor in addition to the heating element 450.

In some embodiments, as described above with reference to FIGS. 2 and 3, the second portion 20B of the lower chip structure 50 may include the second side wiring 260 and the heating element 450, but example embodiments are not limited thereto. For example, referring to FIG. 9, a perspective view schematically illustrating an example of a chip structure according to some embodiments, and FIG. 10, a longitudinal cross-sectional view schematically illustrating an example of a chip structure according to some embodiments, the second portion 20B of the lower chip structure 50 may further include a temperature sensor 470. Thus, the second portion 20B of the lower chip structure 50 may include a temperature sensor 470 in addition to the second side wiring 260 and the heating element 450. In some embodiments, the temperature sensor 470 may be disposed on the same plane as that of the heating element 450 and the second side wiring 260, and the temperature sensor 470 may be formed of the same material as the heating element 450 and the second side wiring 260.

An example with respect to arrangement of the heating element 450 and the temperature sensor 470, according to some embodiments, will be described with reference to FIGS. 10, 11, and 12. FIG. 11 is a block diagram schematically illustrating a region of a cross section of the first lower chip structure 20 and the upper chip structure 10 according to some embodiments, and FIG. 12 is a plan view schematically illustrating the chip structure 1 and the pixel array region PX with heating regions in which the heating element 450 and the temperature sensor 470 are formed according to some embodiments.

Figure 10:
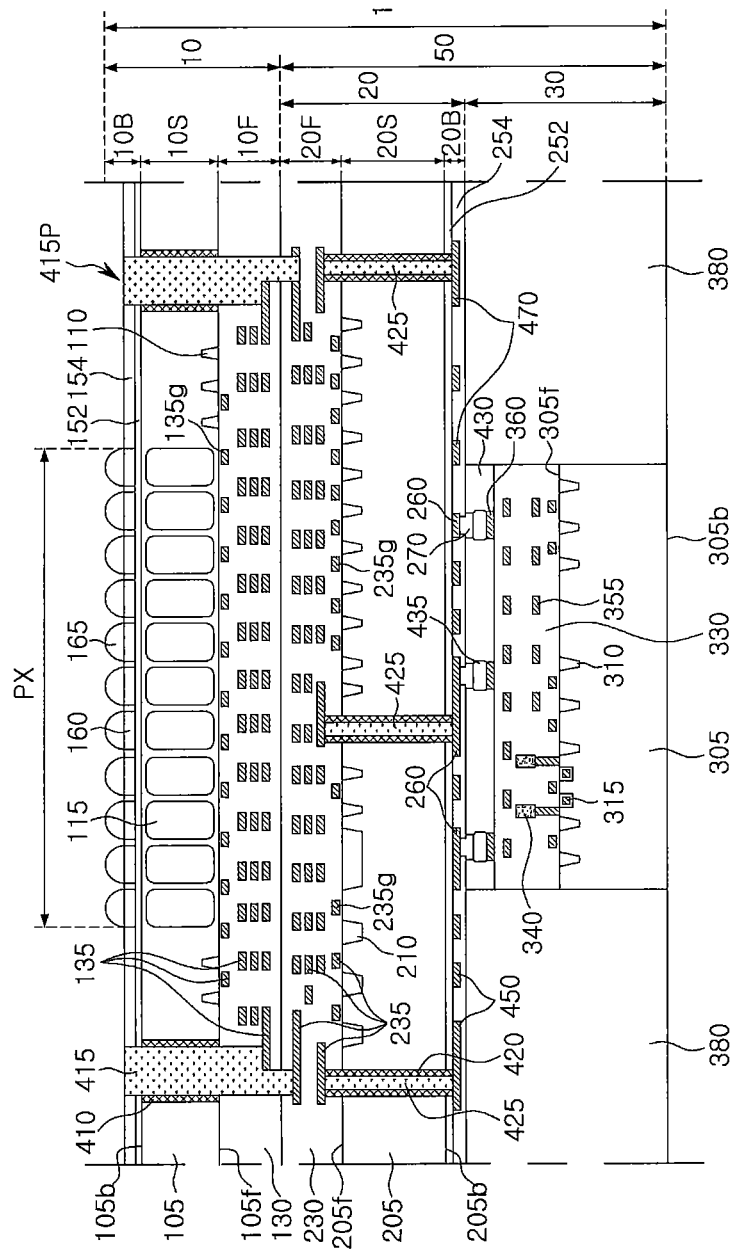
FIG. 10 is a longitudinal cross-sectional view schematically illustrating an example of a chip structure according to some embodiments of the inventive concept.
Figure 11:
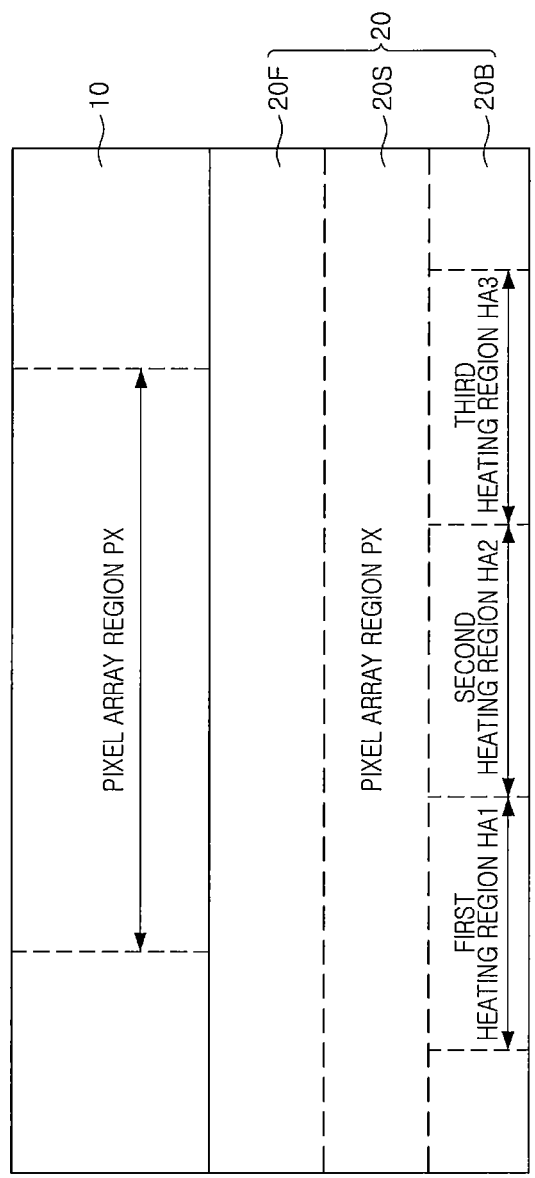
FIG. 11 is a block diagram schematically illustrating a cross-sectional area of a portion of a chip structure to illustrate an example of a chip structure according to some embodiments of the inventive concept.
Figure 12:
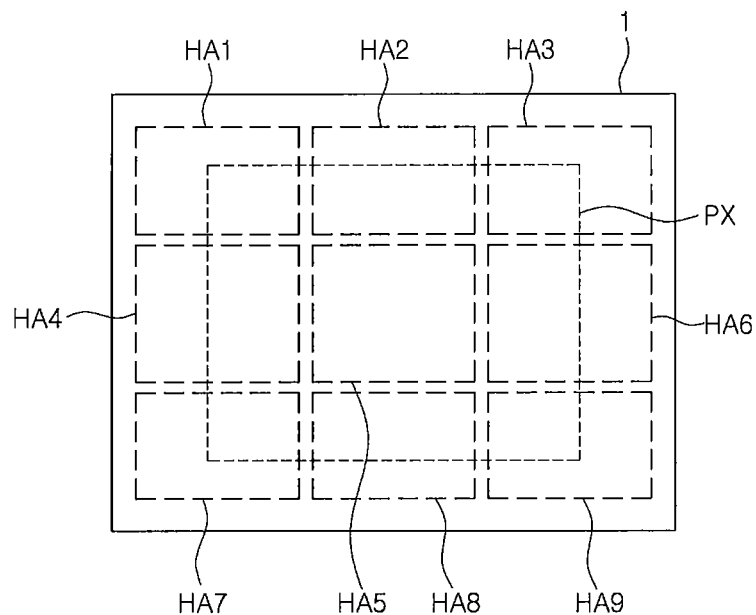
FIG. 12 is a plan view illustrating an example of a chip structure according to some embodiments of the inventive concept.

Referring to FIGS. 10, 11, and 12, the first lower chip structure 20 may include a plurality of heating regions HA1 to HA9. The plurality of heating regions HA1 to HA9 of the first lower chip structure 20 may include the heating element 450 and the temperature sensor 470. The plurality of heating regions HA1 to HA9 may overlap the pixel array region PX.

Figure 13:
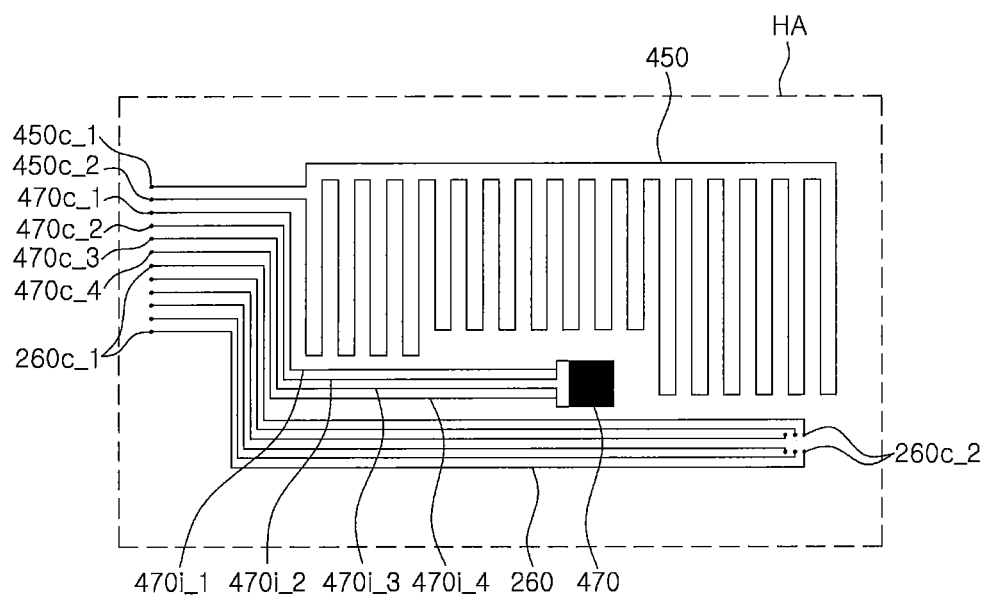
FIG. 13 is a plan view schematically illustrating an enlarged portion of a chip structure according to some embodiments of the inventive concept.

An example embodiment of any one heating region HA, among the plurality of heating regions HA1 to HA9, including the heating element 450 and the temperature sensor 470, will be described with reference to FIG. 13. FIG. 13 is a plan view illustrating an example of the heating region according to some embodiments.

Referring to FIG. 13 in addition to FIGS. 10 through 12, any one heating region HA, among the plurality of heating regions HA1 to HA9, including the heating element 450 and the temperature sensor 470, may include the second side wiring 260 and the heating element 450 having substantially the same cross-sectional structure and a similar planar layout as those illustrated in FIGS. 6 and 7.

The temperature sensor 470 in the heating region HA may be a resistance temperature sensor using the principle in which resistance is changed according to a change in a temperature. The heating region HA may include first to fourth sensor wiring lines 470i_1, 470i_2, 470i_3, and 470i_4 electrically connected to the temperature sensor 470. At end portions of the first to fourth sensor wiring lines 470i_1, 470i_2, 470i_3, and 470i_4, sensor contact regions 470c_1, 470c_2, 470c_3, and 470c_4 electrically connected to the through electrodes (425 of FIG. 10), may be formed. The sensor contact regions 470c_1, 470c_2, 470c_3, and 470c_4 may be disposed on the same plane as that of the first and second heating element contact regions (450c_1 and 450c_2 of FIG. 7) as described with reference to FIG. 7. Among the first to fourth sensor wiring lines 470i_1, 470i_2, 470i_3, and 470i_4, the first sensor wiring line 470i_1 and the fourth sensor wiring line 470i_4 may be voltage lines, spaced apart from each other to be connected to a different portion of the temperature sensor 470, and the second sensor wiring line 470i_2 and the third sensor wiring line 470i_3 may be current lines spaced apart from each other to be connected to a different portion of the temperature sensor 470.

Figure 14:
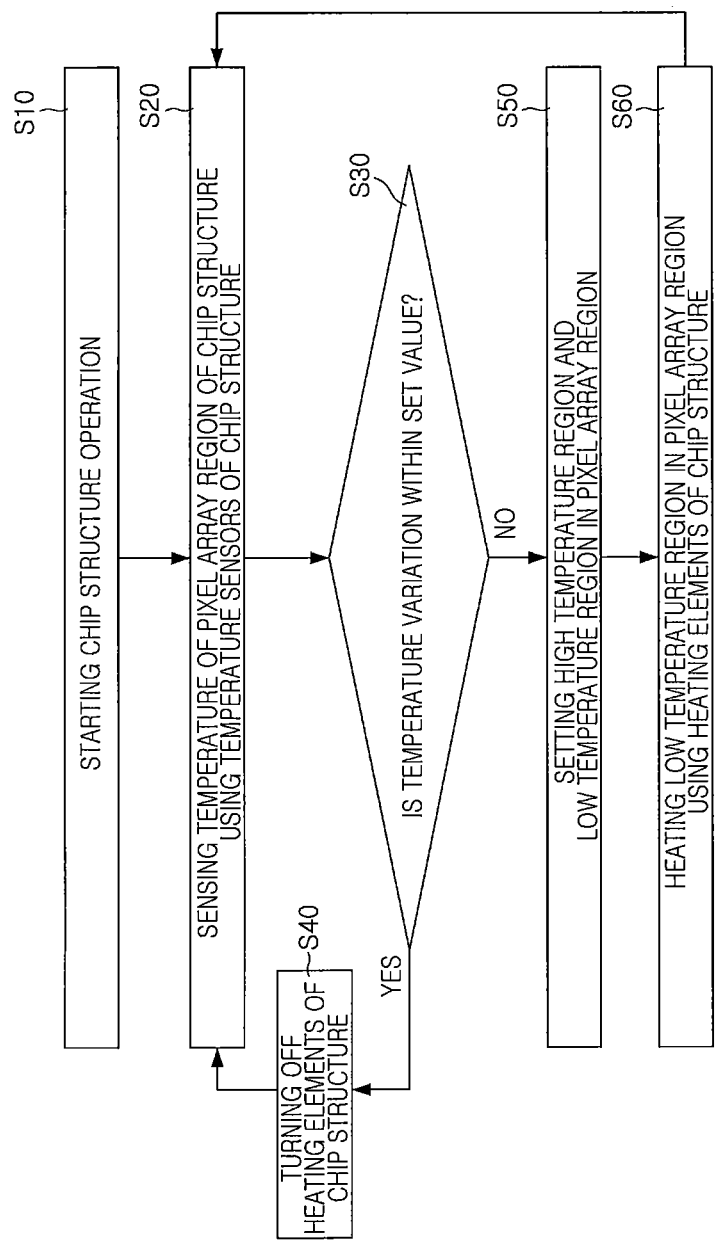
FIG. 14 is a flow chart illustrating an operating method of a chip structure according to some embodiments of the inventive concept.

As described with reference to FIGS. 10 through 13, the plurality of heating regions HA1 to HA9 may include the heating element 450 and the temperature sensor 470. An operating method of the chip structure 1 including the plurality of heating regions HA1 to HA9, according to some embodiments, will be described with reference to FIG. 14. FIG. 14 is a flow chart illustrating an operating method of the chip structure 1 including the plurality of heating regions HA1 to HA9 according to some embodiments.

Referring to FIG. 14 in addition to FIGS. 10 through 13, as described above, the chip structure 1 may include the temperature sensors 470, the heating elements 450, and the pixel array region PX. The chip structure 1 may be operated (S10). The temperature sensors 470 of the chip structure 1 may be used to sense a temperature in the pixel array region PX of the chip structure 1 (S20). Next, it may be determined whether temperature variations of temperatures, which are sensed by the temperature sensors 470, are within a set value (S30). In some embodiments, an internal circuit in the first portion 20F of the first lower chip structure 20 may be used to determine whether temperature variations of temperatures sensed by the temperature sensors 470 are within a set value. When the temperature variation is within a set value, the heating elements 450 of the chip structure 1 may be maintained in a turned off state (S40). However, when the temperature variation is not within a set value, a high temperature region and a low temperature region in the pixel array region PX may be set or determined (S50). The high temperature region and the low temperature region in the pixel array region PX may be set in the pixel array region PX opposing the plurality of heating regions HA1 to HA9. Thus, the pixel array region PX located in a region corresponding to a heating region, in which a temperature sensor, among the temperature sensors 470, sensing a high temperature is located, may be set as a high temperature region, and the pixel array region PX located in a region corresponding to a heating region, in which a temperature sensor, among the temperature sensors 470, sensing a low temperature is located, may be set as a low temperature region.

Next, the heating elements 450 of the chip structure 1 may be used to heat the low temperature region in the pixel array region PX (S60). As described above, heating the low temperature region in the pixel array region PX may include heating a heating element, among the heating elements 450, located in a heating region in which, among the temperature sensors 470, a temperature sensor for sensing a low temperature, is located. Next, sensing a temperature in the pixel array region may be repeatedly performed.

Thus, the temperature sensors 470 and the heating elements 450 are used to increase a temperature of the low temperature region of the pixel array region PX, so a temperature variation in the pixel array region PX may be significantly reduced. Thus, according to example embodiments, a temperature variation in the pixel array region PX is significantly reduced, so image errors may be reduced or prevented.

Figure 9:
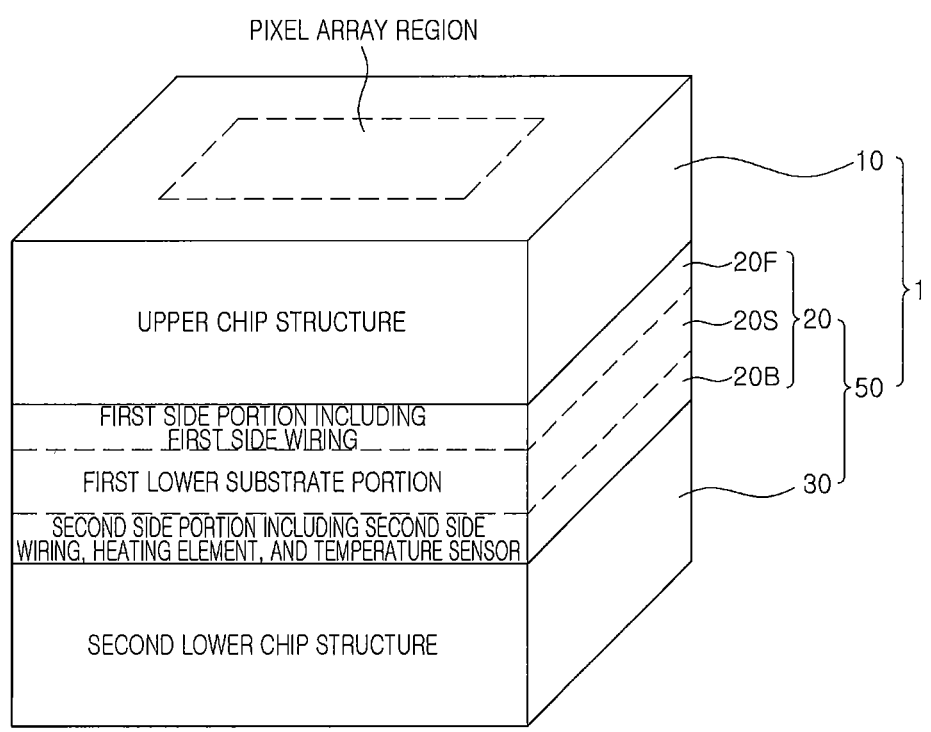
FIG. 9 is a perspective view schematically illustrating an example of a chip structure according to some embodiments of the inventive concept.
Figure 15:
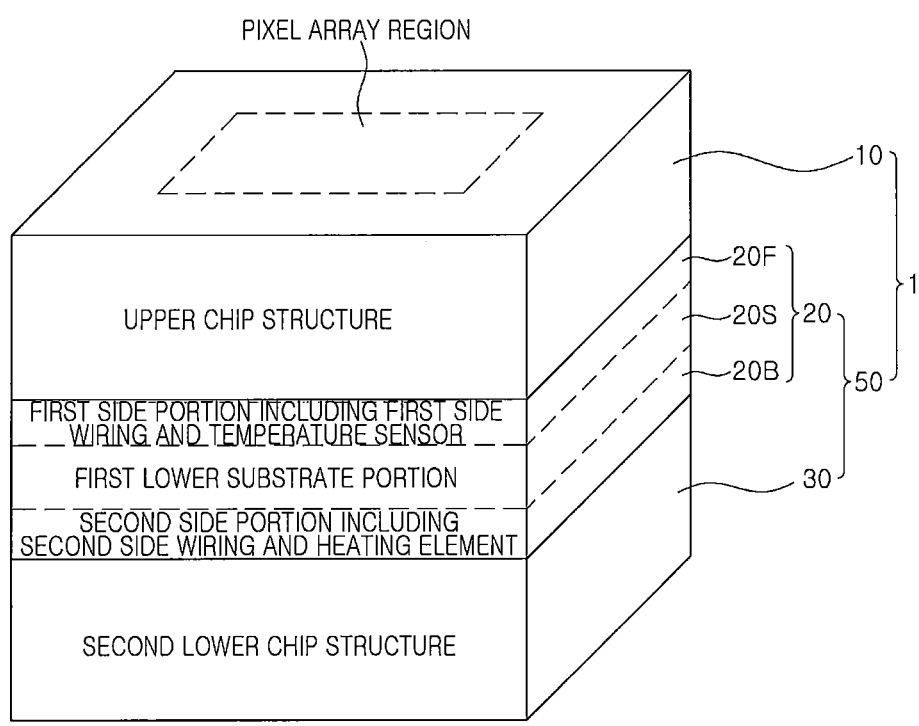
FIG. 15 is a perspective view schematically illustrating an example of a chip structure according to some embodiments of the inventive concept.
Figure 16:
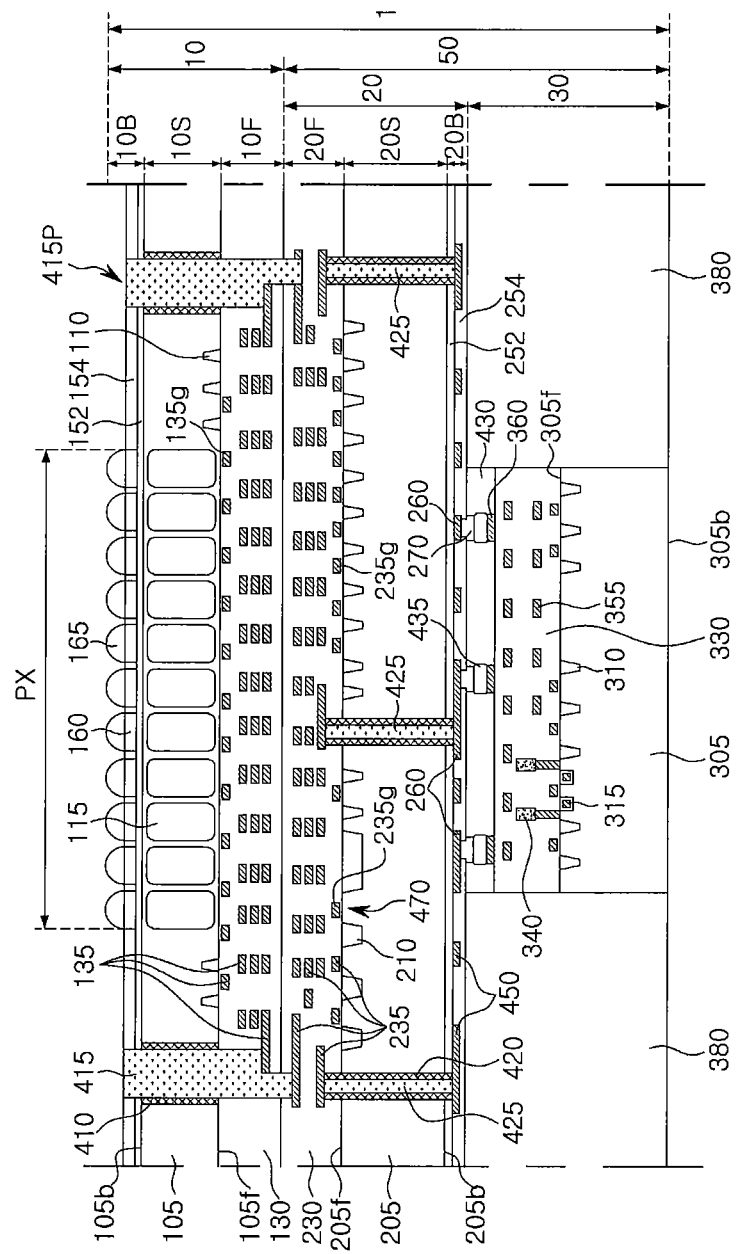
FIG. 16 is a longitudinal cross-sectional view schematically illustrating an example of a chip structure according to some embodiments of the inventive concept.

In an example embodiment, as described with reference to FIGS. 9 and 10, the temperature sensor 470 and the heating element 450 may be disposed on the same plane in the second portion 20B of the first lower chip structure 20, but example embodiments are not limited thereto. For example, as illustrated in FIG. 15, a temperature sensor may be disposed in the first portion 20F of the first lower chip structure 20, and a heating element may be disposed in the second portion 20B of the first lower chip structure 20. FIG. 15 is a conceptual perspective view corresponding to FIG. 9. In an example embodiment, as illustrated in FIG. 16, a temperature sensor 470 may be a sensor capable of sensing a change in a temperature using a transistor and/or a diode formed over the first side 205f and/or the first portion 20F of the first lower semiconductor substrate 205 of the first lower chip structure 20.

Figure 17:
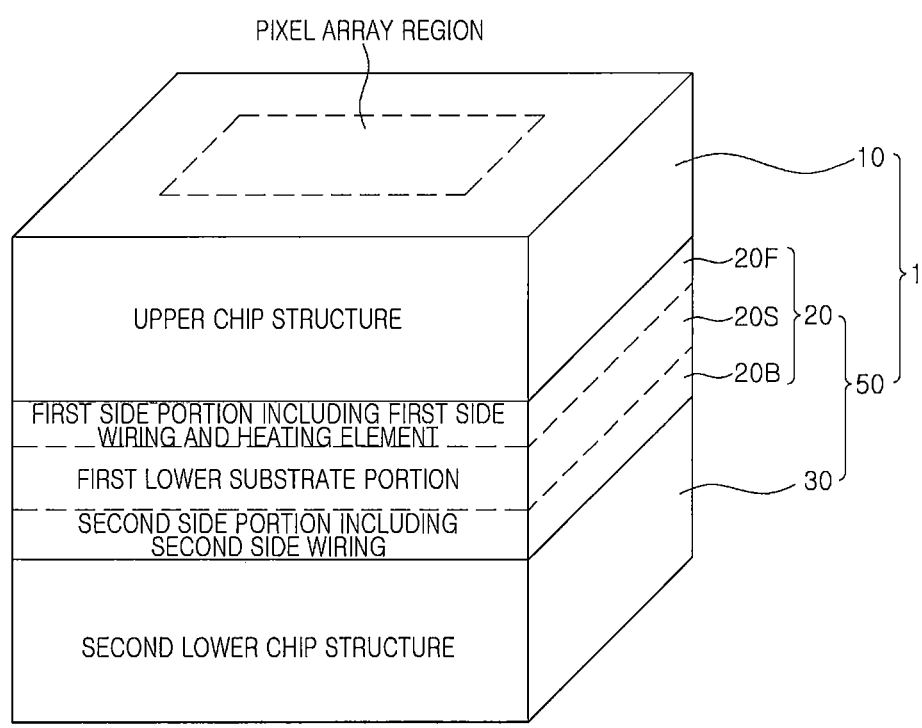
FIG. 17 is a perspective view schematically illustrating an example of a chip structure according to some embodiments of the inventive concept.

In an example embodiment, as described with reference to FIGS. 2 and 3, the heating element 450 may be disposed in the second portion 20B of the first lower chip structure 20, but example embodiments are not limited thereto. For example, as illustrated in FIG. 17, a heating element may be disposed in the first portion 20F of the first lower chip structure 20. FIG. 17 is a conceptual perspective view corresponding to FIG. 2.

Figure 18:
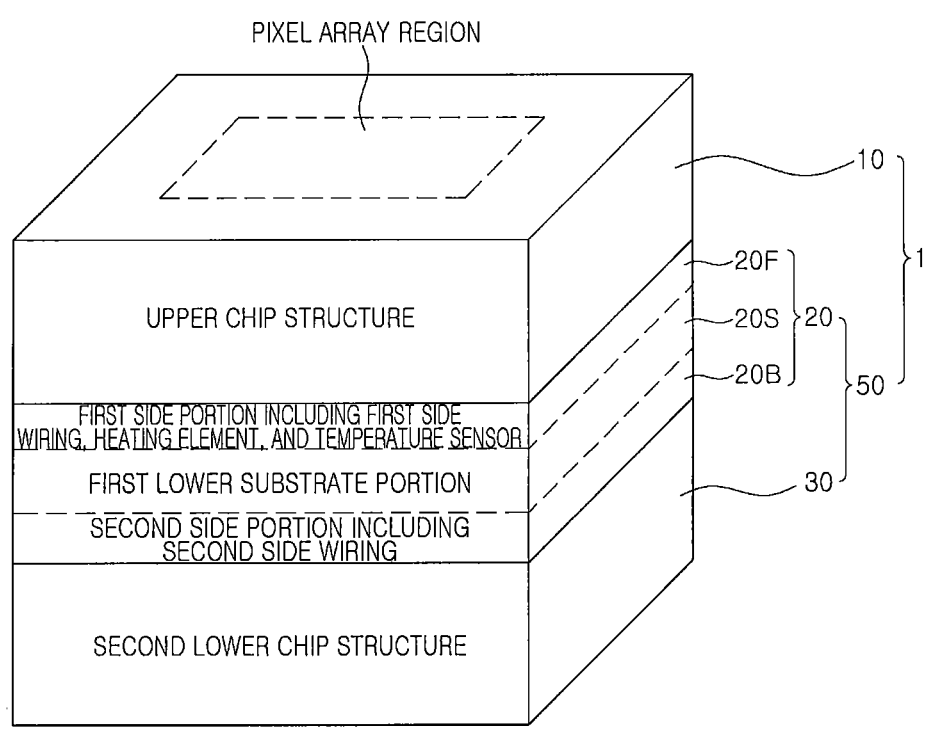
FIG. 18 is a perspective view schematically illustrating an example of a chip structure according to some embodiments of the inventive concept.

In an example embodiment, as described with reference to FIGS. 9 and 10, the temperature sensor 470 and the heating element 450 may be disposed in the second portion 20B of the first lower chip structure 20, but example embodiments are not limited thereto. For example, as illustrated in FIG. 18, a temperature sensor and a heating element may be disposed in the first portion 20F of the first lower chip structure 20. FIG. 18 is a conceptual perspective view corresponding to FIG. 9.

Figure 19:
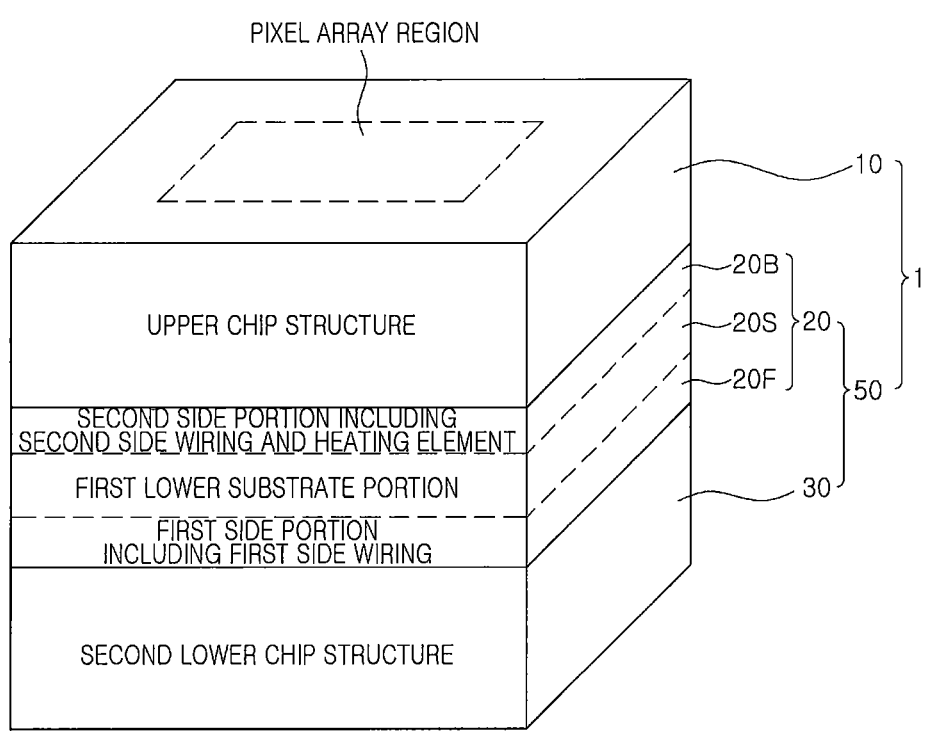
FIG. 19 is a perspective view schematically illustrating an example of a chip structure according to some embodiments of the inventive concept.
Figure 20:
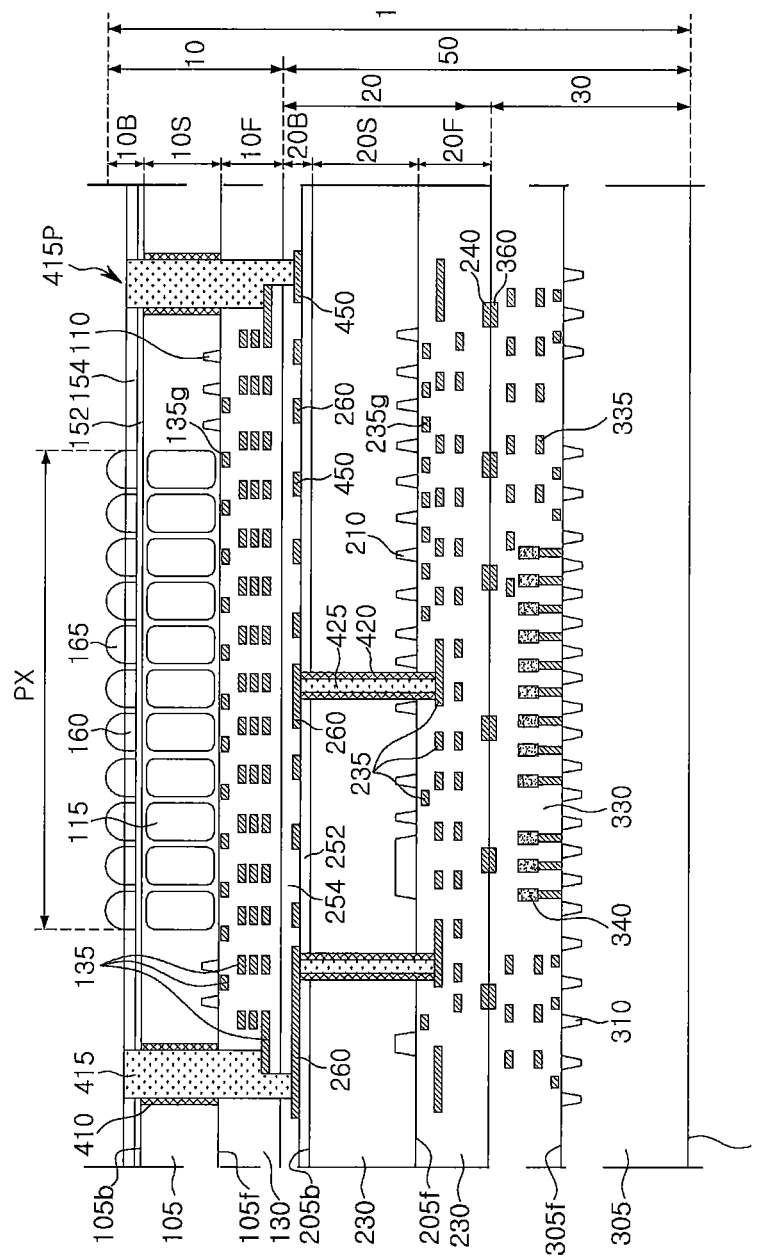
FIG. 20 is a longitudinal cross-sectional view schematically illustrating an example of a chip structure according to some embodiments of the inventive concept.

In an example embodiment, as described with reference to FIGS. 2 and 3, the first portion 20F of the first lower chip structure 20 may be closer to the upper chip structure 10 than the second portion 20B of the first lower chip structure 20, but example embodiments are not limited thereto. For example, as illustrated in FIGS. 19 and 20, the second portion 20B of the first lower chip structure 20 may be disposed closer to the upper chip structure 10 than the first portion 20F of the first lower chip structure 20, and a heating element 450 may be disposed in the second portion 20B of the first lower chip structure 20. Referring to FIGS. 19 and 20, upper through electrodes 415 in the upper chip structure 10 may extend into the second portion 20B of the first lower chip structure 20 to be electrically connected to the heating element 450 and the second side wiring 260.

A second lower chip structure 30 may be formed to have the same width as that of the first lower chip structure 20. The second lower chip structure 30 may include a second lower semiconductor substrate 305, a first side insulating layer 330 disposed on a first side 305f of the second lower semiconductor substrate 305, as well as a first side wiring 335 and a data storage element 340 in the first side insulating layer 330. The first portion 20F of the first lower chip structure 20 may be combined with the first side insulating layer 330 of the second lower chip structure 30. In some embodiments, a front side pad 240 of the first portion 20F of the first lower chip structure 20 may be in contact with a front side pad 360 of the first side insulating layer 330 of the second lower chip structure 30 so as to be electrically connected to each other.

Figure 21:
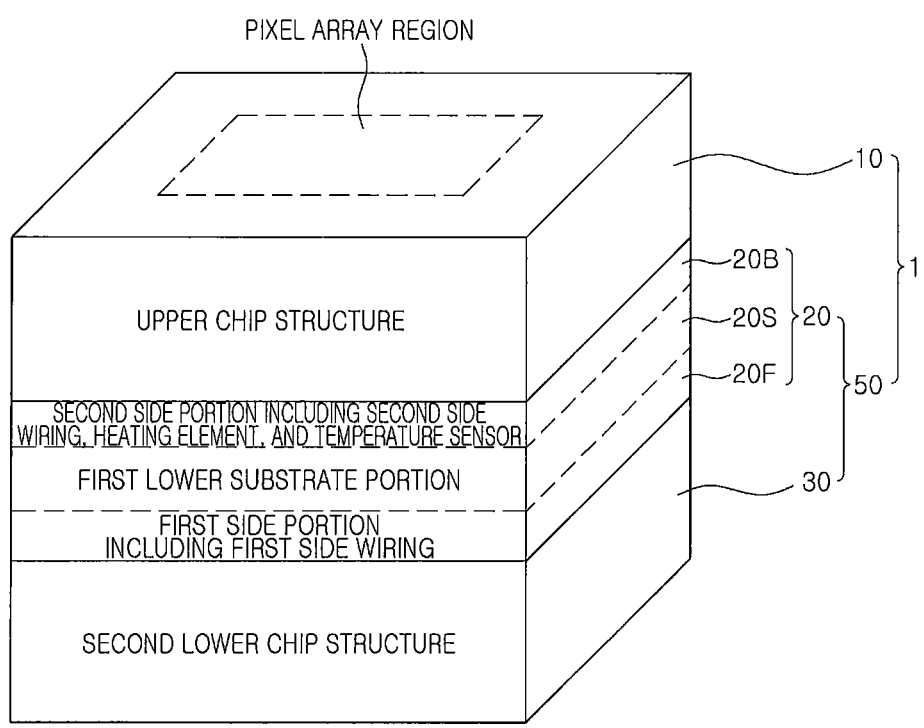
FIG. 21 is a perspective view schematically illustrating an example of a chip structure according to some embodiments of the inventive concept.

As described with reference to FIGS. 19 and 20, the second portion 20B of the first lower chip structure 20 close to the upper chip structure 10 may include the heating element, but example embodiments are not limited thereto. For example, as illustrated in FIG. 21, the second portion 20B of the first lower chip structure 20 close to the upper chip structure 10 may include a temperature sensor with the heating element.

Figure 22:
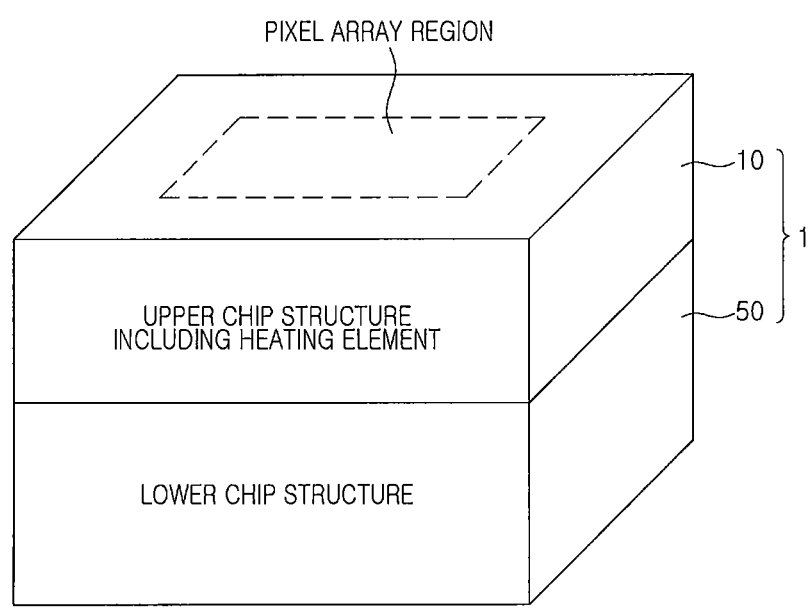
FIG. 22 is a perspective view schematically illustrating an example of a chip structure according to some embodiments of the inventive concept.

As illustrated in FIG. 1, the heating element may be included in the lower chip structure, but example embodiments are not limited thereto. For example, as illustrated in FIG. 22, a heating element may be included in an upper chip structure. For example, the heating element may be disposed in the first portion 10F of the upper chip structure 10 in FIG. 3.

The second lower chip structure 30 as described with reference to FIG. 3 may be formed of a single semiconductor chip, but example embodiments are not limited thereto. In other embodiments, the second lower chip structure 30 may further include another chip with a single semiconductor chip. Examples described above will be described further with reference to FIGS. 23 through 25.

Figure 23:
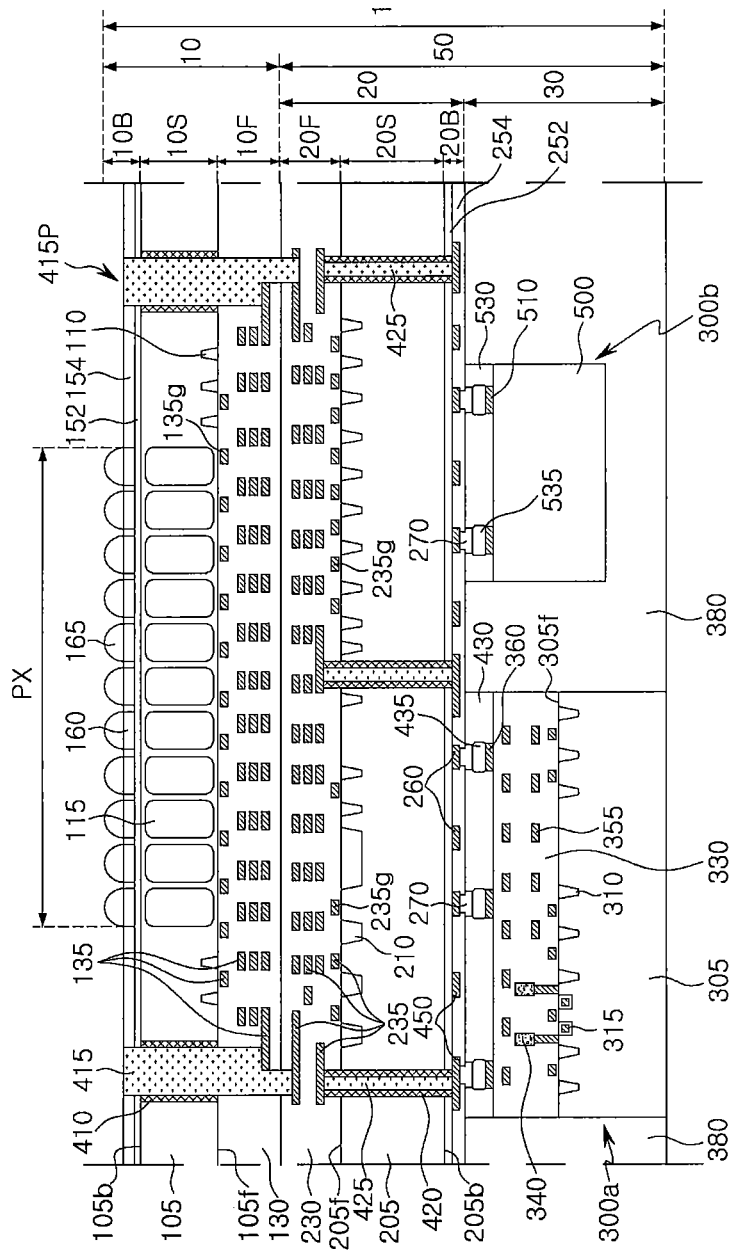
FIG. 23 is a longitudinal cross-sectional view schematically illustrating an example of a chip structure according to some embodiments of the inventive concept.

First, referring to FIG. 23, the second lower chip structure 30 may include a first semiconductor chip 300a including the second lower semiconductor substrate 305, the first side insulating layer 330, the data storage element 340, and the front side pad 360, as illustrated in FIG. 3. In addition, the second lower chip structure 30 may include a peripheral portion 300b having a smaller size than that of the first semiconductor chip 300a. The peripheral portion 300b may include one or more components for improving functionality of the chip structure 1, for example, a buffer chip, a driver chip, a power management integrated circuit (IC), an analog element, a communications element, a controller chip, and/or a passive element. The communications element may be a wireless communication chip. The passive element may be a passive element, such as a capacitor, or the like.

The peripheral portion 300b may be electrically connected to the first lower chip structure 20 by conductive connectors 535 disposed between terminals 510 of the peripheral portion 300b and back side pads 270 of the first lower chip structure 20. A side surface and a lower surface of the peripheral portion 300b may be surrounded by a molding layer 380. An insulating layer 530 may be disposed between the peripheral portion 300b and the first lower chip structure 20.

Figure 24:
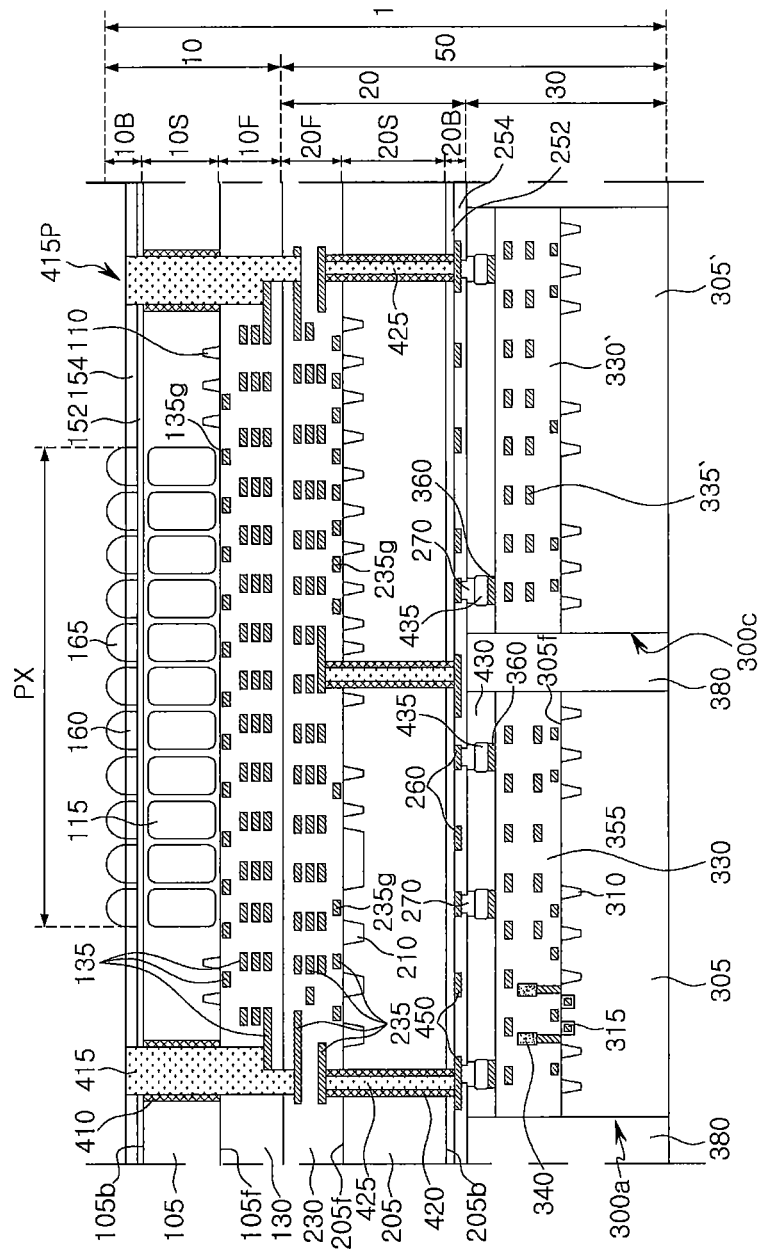
FIG. 24 is a longitudinal cross-sectional view schematically illustrating an example of a chip structure according to some embodiments of the inventive concept.

Next, referring to FIG. 24, the second lower chip structure 30 may include the first semiconductor chip 300a as illustrated in FIG. 23. In addition, in the second lower chip structure 30, a second semiconductor chip 300c spaced apart from the first semiconductor chip 300a and electrically connected to the first lower chip structure 20 may be disposed therein. The second semiconductor chip 300c may include a third semiconductor substrate 305', a first side insulating layer 330' on the third semiconductor substrate 305', and internal wirings 335' in the first side insulating layer 330'. The second semiconductor chip 300c may be a semiconductor element, such as a memory element, a logic element, or the like. The second semiconductor chip 300c may be electrically connected to the first lower chip structure 20 by a conductive connector 435 between a front side pad 360 of the second semiconductor chip 300c and the back side pad 270 of the first lower chip structure 20. Side surfaces of the first semiconductor chip 300a and the second semiconductor chip 300c may be covered by a molding layer 380.

Figure 25:
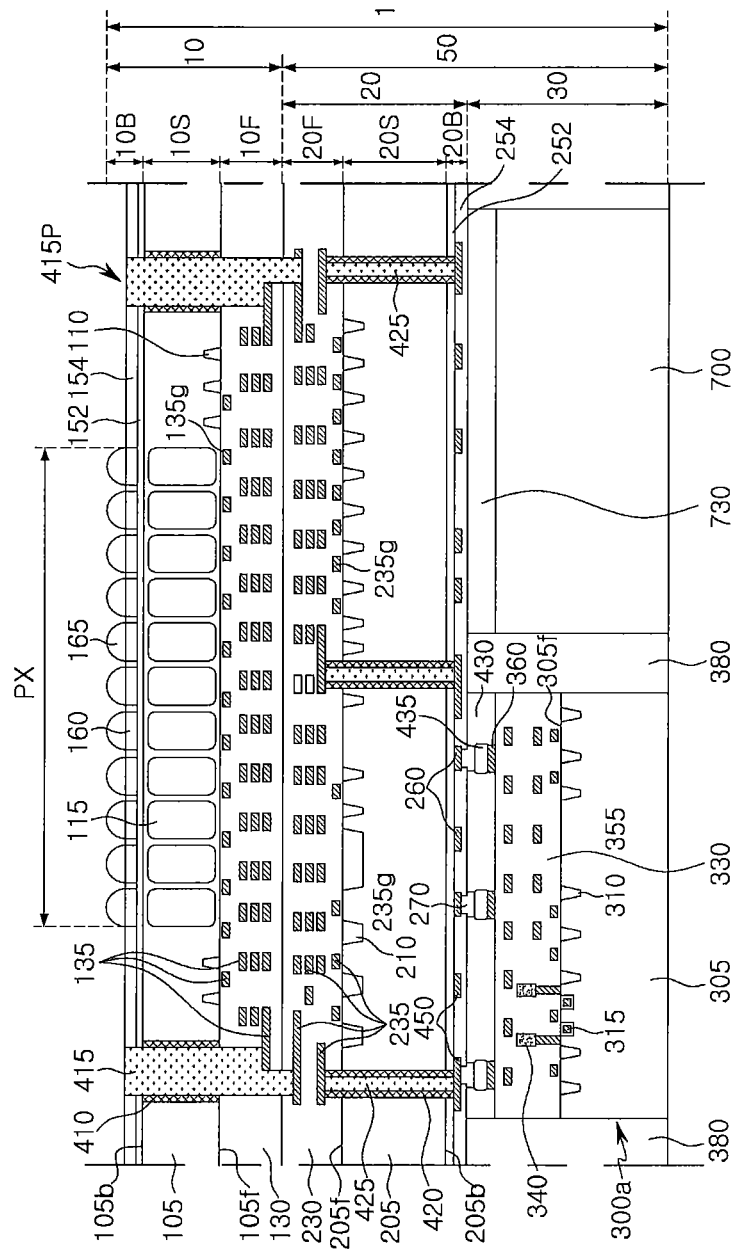
FIG. 25 is a longitudinal cross-sectional view schematically illustrating an example of a chip structure according to some embodiments of the inventive concept.

Next, referring to FIG. 25, the second lower chip structure 30 may include a dummy chip 700, with the first semiconductor chip 300a as illustrated in FIG. 23. An insulating layer 730 may be disposed between the dummy chip 700 and the first lower chip structure 20. Side surfaces of the first semiconductor chip 300a and the dummy chip 700 may be covered by a molding layer 380. The dummy chip 700 may be formed of a semiconductor substrate.

The chip structure 1 as described above may be formed of a plurality of chips including an image sensor chip. For example, in the chip structure 1, the upper chip structure 10 may be an image sensor chip, the first lower chip structure 20 may be a processor chip, and the second lower chip structure 30 may be a memory chip. As described above, a plurality of chips are included in a single chip structure or a single package, which may be advantageous for the miniaturization of an electronic product for a general consumer, such as a digital camera, a camera for a mobile phone, and a portable camcorder, including the chip structure 1.

The chip structure 1 as described above may include the heating element 450 capable of significantly reducing a temperature variation in the pixel array region PX of the upper chip structure 10. The heating element 450 described above may reduce or prevent image errors, which may occur in a product including an image sensor. Thus, the chip structure 1 including the heating element 450 is mounted not only in an electronic product for a general consumer, such as a digital camera, a camera for a mobile phone, a portable camcorder, or the like, but also in a camera mounted of a vehicle, a security device, a robot, or the like, to provide high resolution for certain applications.

As set forth above, according to example embodiments of the present inventive concept, a chip structure including a heating element capable of significantly reducing a temperature variation in a pixel array region may be provided. Thus, the chip structure including the heating element may provide high resolution in a product including an image sensor.

As set forth above, according to example embodiments of the present inventive concept, a chip structure formed of a plurality of chips may be provided. Thus, the chip structure may facilitate miniaturization of electronic products, such as a digital camera, a camera for a mobile phone, a portable camcorder, or the like.

While example embodiments have been shown and described above, it will be apparent to those skilled in the art that modifications and variations could be made without departing from the scope of the present disclosure, as defined by the appended claims.

What is claimed is:

1. A chip structure operating method, comprising:
   forming a chip structure comprising temperature sensors, heating elements, and a pixel array region;
   operating the chip structure;
   determining a high temperature region and a low temperature region in the pixel array region by sensing temperatures in the pixel array region using the temperature sensors; and
   heating the low temperature region in the pixel array region using the heating elements,
   wherein the chip structure comprises:
   a first lower chip structure; and
   an upper chip structure on the first lower chip structure and having a pixel array region,
   wherein the first lower chip structure comprises:
   a first lower semiconductor substrate having a first side and a second side opposing each other;
   a first portion on the first side of the first lower semiconductor substrate; and
   a second portion on the second side of the first lower semiconductor substrate,
   wherein the first portion of the first lower chip structure comprises a gate wiring,
   wherein the second portion of the first lower chip structure comprises a second side wiring and the heating elements,
   wherein at least one of the heating elements is on a same plane as that of the second side wiring,
   wherein the second side wiring comprises a first surface having a first wiring contact region, and a second surface having a second wiring contact region and opposing the first surface, and
   wherein the at least one of the heating elements comprises a first heating element side having a first heating element contact region and a second heating element contact region, and a second heating element side opposing the first heating element side, and wherein the first lower chip structure further comprises:
a first heating element electrode electrically connected to the first heating element contact region;
a second heating element electrode electrically connected to the second heating element contact region;
a first wiring electrode electrically connected to the first wiring contact region; and
a second wiring electrode electrically connected to the second wiring contact region.

2. The chip structure operating method of claim 1, wherein the first lower chip structure comprises the temperature sensors.

3. The chip structure operating method of claim 1, wherein the second portion of the first lower chip structure comprises the temperature sensors.

4. The chip structure operating method of claim 1, wherein the first portion is closer than the second portion to the upper chip structure.

5. The chip structure operating method of claim 1, wherein the at least one of the heating elements has a length greater than that of the second side wiring.

6. The chip structure operating method of claim 1, wherein the first heating element electrode, the second heating element electrode, and the first wiring electrode are through electrodes passing through the first lower semiconductor substrate.

7. The chip structure of claim 1, wherein the first lower chip structure comprises the temperature sensors, and
wherein the temperature sensors are on substantially a same plane as that of the second side wiring and the heating elements.

8. The chip structure of claim 1, further comprising a second lower chip structure, the first lower chip structure being between the upper chip structure and the second lower chip structure,
wherein the second lower chip structure, the first lower chip structure, and the upper chip structure are electrically connected to each other,
wherein the second side wiring is electrically connected to the second lower chip structure, and
wherein the heating elements are insulated from the second lower chip structure.

9. A chip structure operating method, comprising:
forming a chip structure comprising temperature sensors, heating elements, and a pixel array region;
operating the chip structure;
determining a high temperature region and a low temperature region in the pixel array region by sensing temperatures in the pixel array region using the temperature sensors; and
heating the low temperature region in the pixel array region using at least one of the heating elements,
wherein the chip structure comprises:
a first lower chip structure comprising the at least one of the heating elements; and
an upper chip structure on the first lower chip structure and comprising the pixel array region.

10. The chip structure operating method of claim 9, wherein an arrangement density of the heating elements is configured to reduce temperature differences between different areas of the pixel array region.

11. The chip structure operating method of claim 9, wherein the first lower chip structure further comprises:
a first lower semiconductor substrate having a first side and a second side opposing each other;
a first portion on the first side of the first lower semiconductor substrate; and
a second portion on the second side of the first lower semiconductor substrate,
wherein the first portion of the lower chip structure comprises a gate wiring, and
wherein the second portion of the first lower chip structure comprise a second side wiring and the at least one of the heating elements.

12. The chip structure operating method of claim 11, wherein the second portion of the first lower chip structure comprises the temperature sensors.

13. The chip structure operating method of claim 11, wherein the first portion of the first lower chip structure is in contact with the upper chip structure.

14. The chip structure of claim 11, further comprising a second lower chip structure, the first lower chip structure being between the upper chip structure and the second lower chip structure,
wherein the second lower chip structure, the first lower chip structure, and the upper chip structure are electrically connected to each other,
wherein the second side wiring is electrically connected to the second lower chip structure, and
wherein the heating elements are insulated from the second lower chip structure.

15. The chip structure operating method of claim 9, wherein the first lower chip structure comprises the temperature sensors.

16. A chip structure operating method, comprising:
operating a chip structure comprising temperature sensors, heating elements, and a pixel array region,
determining a high temperature region and a low temperature region in the pixel array region by sensing temperatures in the pixel array region using the temperature sensors, and
heating the low temperature region in the pixel array region using the heating elements,
wherein an arrangement density of the heating elements is configured to reduce temperature differences between different areas of the pixel array region.

17. The chip structure operating method of claim 16, wherein the chip structure comprises a lower chip structure and an upper chip structure on the lower chip structure,
the lower chip structure comprises the temperature sensors and the heating elements, and
the upper chip structure comprises the pixel array region.

18. The chip structure operating method of claim 17, wherein the lower chip structure comprises:
a lower semiconductor substrate having a first side and a second side opposing each other;
a first portion on the first side of the lower semiconductor substrate; and
a second portion on the second side of the lower semiconductor substrate,
wherein the first portion comprises a gate wiring, and
the second portion comprises the heating elements.

19. The chip structure operating method of claim 18, wherein the second portion comprises the temperature sensors.

20. The chip structure operating method of claim 18, wherein the first portion is closer than the second portion to the upper chip structure.

* * * * *